US007391838B2

(12) United States Patent
Caresosa et al.

(10) Patent No.: US 7,391,838 B2
(45) Date of Patent: Jun. 24, 2008

(54) TRANSCEIVER SYSTEM AND METHOD SUPPORTING MULTIPLE SELECTABLE VOLTAGE CONTROLLED OSCILLATORS

(75) Inventors: Mario Caresosa, Rancho Santa Margarita, CA (US); Namik Kocaman, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 660 days.

(21) Appl. No.: 10/444,023

(22) Filed: May 22, 2003

(65) Prior Publication Data

US 2004/0086029 A1  May 6, 2004

Related U.S. Application Data

(60) Provisional application No. 60/423,072, filed on Nov. 1, 2002.

(51) Int. Cl.
*H03D 3/24* (2006.01)
(52) U.S. Cl. ...................................... 375/376

(58) Field of Classification Search ................ 375/376, 375/327, 371, 373, 374, 375; 455/255, 265, 455/76; 331/2, 25, 34, 57; 327/144, 145, 327/146, 147, 156
See application file for complete search history.

(56) References Cited

U.S. PATENT DOCUMENTS

| 4,488,123 | A | * | 12/1984 | Kurihara .................. 331/2 |
| 4,519,086 | A | * | 5/1985 | Hull et al. .................. 375/376 |
| 4,958,228 | A | * | 9/1990 | Kutsuki .................. 348/537 |
| 5,389,898 | A | * | 2/1995 | Taketoshi et al. .............. 331/2 |
| 6,864,752 | B2 | | 3/2005 | Caresosa |
| 7,053,720 | B2 | | 5/2006 | Caresosa |

* cited by examiner

*Primary Examiner*—Sam K. Ahn
(74) *Attorney, Agent, or Firm*—McAndrews, Held & Malloy, Ltd.

(57) ABSTRACT

A phase lock loop comprising a plurality of voltage controlled oscillators is presented herein. The phase lock loop can provide a wide range of output frequencies with low jitter. Additionally, the phase lock loop can be incorporated into a clock multiplier unit and a clock and data recovery unit.

11 Claims, 5 Drawing Sheets

TRANSCEIVER SYSTEM AND METHOD SUPPORTING MULTIPLE SELECTABLE VOLTAGE CONTROLLED OSCILLATORS

RELATED APPLICATIONS

The present application claims priority to Provisional Patent Application Ser. No. 60/423,072, "Transceiver System and Method Supporting Multiple Selectable Voltage Controlled Oscillators", by Caresosa, et. al., filed Nov. 1, 2002.

Additionally, the present application is related to the following applications which are incorporated herein by reference:

| Ser. No. | Title | Docket No. | Filed | Inventor(s): |
|---|---|---|---|---|
| 60/423,070 | Transceiver System and Method Supporting Variable Rates an Multiple Protocols | 14103US01 | Nov. 1, 2002 | Vikran Natarajan, Kang Xioa, Mario Caresosa, Jay Proano, David Chang, Afshin Momtaz, Randy Stolaruk |
| 60/423,166 | Two Wire Bus for a Transceiver System | 14104US01 | Nov. 1, 2002 | Chenmin Zhang, Steve Thomas, Randall Stolaruk |
| 60/423,294 | System and Method Supporting Auto-Recovery in a Transceiver System | 14105US01 | Nov. 1, 2002 | Kang Xiao, Mario Caresosa, Hongtao Jiang, Randall Stolaruk |
| 60/423,071 | Method Supporting Transceiver and Framer Synchronization | 14106US01 | Nov. 1, 2002 | Jay Proano, Sheila Qiu, Tim Chan, Hongtao Jiang |
| 60/423,034 | Multi-Rate On-Chip OCN Filter for a Transceiver System | 14107US01 | Nov. 1, 2002 | Ichiro Fujimori, Mario Caresosa, and Namik Kocaman |
| 60/423,074 | Configurable VCO System and Method | 14109US01 | Nov. 1, 2002 | Mario Caresosa, Namik Kocaman, Afshin Momtaz |

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Synchronous Optical Networking (SONET) is a standard way to multiplex high-speed traffic from multiple vendors' multiplexers onto fiber optic cabling. SONET equipment and software enable network providers to carry traffic from many types of customer equipment in a uniform way on backbone fiber optic cabling.

SONET is slightly different in the long haul space compared to the metro space. The long haul space is [please fill in the blank with a brief description of the long haul space]. The metro space is [please fill in the blank with a brief description of the metro space]. SONET for the metro space provides additional functionality for other protocols, such as Gigabit Ethernet, ESCON, FIBERCON, Fiber Channel 2X, and HDTV, to name a few.

Service providers provide services to various customers by provisioning a line card for the customer. Line cards handle one of a several standard rates. TABLE 1 identifies a list of different rates. In order to provide customers with different data rates, service providers install different line cards, wherein each line card handles a different data rate. In cases where a service provider has many customers, it is likely that the service provider has many line cards to accommodate the different user requirements. However, in cases where a service provider has fewer customers, it is likely that the service provider will need to purchase a new line card to accommodate a new customer with different rate requirements.

TABLE 1

| Optical Level | Electrical Level | Line Rate (Mbps) | Payload Rate (Mbps) | Overhead Rate (Mbps) |
|---|---|---|---|---|
| OC-1 | STS-1 | 51.840 | 50.112 | 1.728 |
| OC-3 | STS-3 | 155.520 | 150.336 | 5.184 |
| OC-9 | STS-9 | 466.560 | 451.008 | 15.552 |
| OC-12 | STS-12 | 622.080 | 601.344 | 20.736 |
| OC-18 | STS-18 | 933.120 | 902.016 | 31.104 |
| OC-24 | STS-24 | 1244.160 | 1202.688 | 41.472 |
| OC-36 | STS-36 | 1866.240 | 1804.032 | 62.208 |
| OC-48 | STS-48 | 2488.320 | 2405.376 | 82.944 |

In order to provide different data rates from the same infrastructure, reference clock signals with different frequencies are needed. One possible solution is to use a single voltage controlled oscillator with a wide range of possible frequencies.

Although the particular frequency can be provided by application of an appropriate control voltage to a voltage controlled oscillator with a wide range of possible frequencies, such oscillators are difficult to control. Voltage controlled oscillators with a wide range of possible frequencies are very sensitive to changes in the control voltage. Therefore, such oscillators tend to be less stable and more susceptible to jitter.

Further limitations and disadvantages of connection and traditional approaches will become apparent to one of skill in the art, through comparison of such systems with embodiments of the present invention as set forth in the remainder of the present application.

BRIEF SUMMARY OF THE INVENTION

Presented herein is a phase lock loop with multiple voltage controlled oscillators (VCOs). A particular one of the voltage oscillators can be selected, thereby allowing for generation of an output signal with any one of a plurality of frequencies. The phase lock loop can form a portion of a clock and data recovery unit (CDR) or a clock management unit (CMU) in a multirate transceiver.

These and other advantages, aspects and novel features of the present invention, as well as details of illustrated embodiments thereof, will be more fully understood from the following description and drawings.

DETAILED DESCRIPTION OF THE INVENTION

Figure 1:
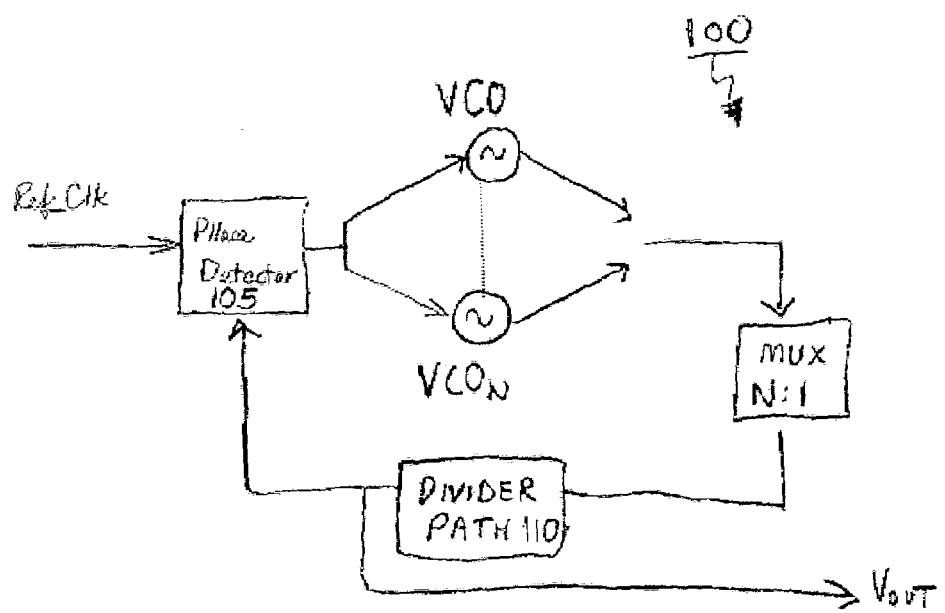
FIG. 1 is a block diagram of a phase lock loop with a plurality of voltage controlled oscillators in accordance with an embodiment of the invention.

Referring now to FIG. 1, there is illustrated a block diagram of an exemplary phase lock loop 100 in accordance with an embodiment of the present invention. The phase lock loop 100 synchronizes reference clock signal, ref_clk, to a signal with any one of a plurality of different frequencies, $f_0 \ldots f_n$, thereby providing an output signal $V_{out}$.

The reference clock signal, ref_clk, is received at a phase detector 105. The phase detector 105 provides an output signal that is a function of the phase difference between the reference clock signal, ref_clk, and a feedback signal.

The phase lock loop comprises a plurality of voltage controlled oscillators (VCOs), $VCO_1 \ldots VCO_n$. Each VCO, $VCO_1 \ldots VCO_n$, is centered at a particular frequency, $f_1 \ldots f_n$. The VCOs provide a signal with a frequency that is offset from the center frequency. The offset is controllable by the voltage level applied to the VCO.

Each of the VCOs are connected to an N:1 multiplexer, MUX, which selectively connects a particular one of the voltage controlled oscillators to a divider path 110. The divider path 110 divides the frequency of an incoming signal by a particular factor. The divider path 110 provides the output signal, $V_{out}$. The output signal, $V_{out}$, is fed back to the phase detector 105.

Alternatively, the divider path 110 is omitted and the output of the MUX is provided directly to the phase detector 105. In one embodiment, the particular VCO can be programmably selected, and the remaining VCO's disabled. Disabling VCO's that are not selected reduces noise and interference.

This multiple selectable VCOs of the present invention can also be used in conjunction with the teachings of "Configurable Voltage Controlled Oscillator System and Method", Provisional Application for Patent, Ser. No. 60/423,074, by Caresosa, et. al., which is incorporated herein by reference.

Figure 2:
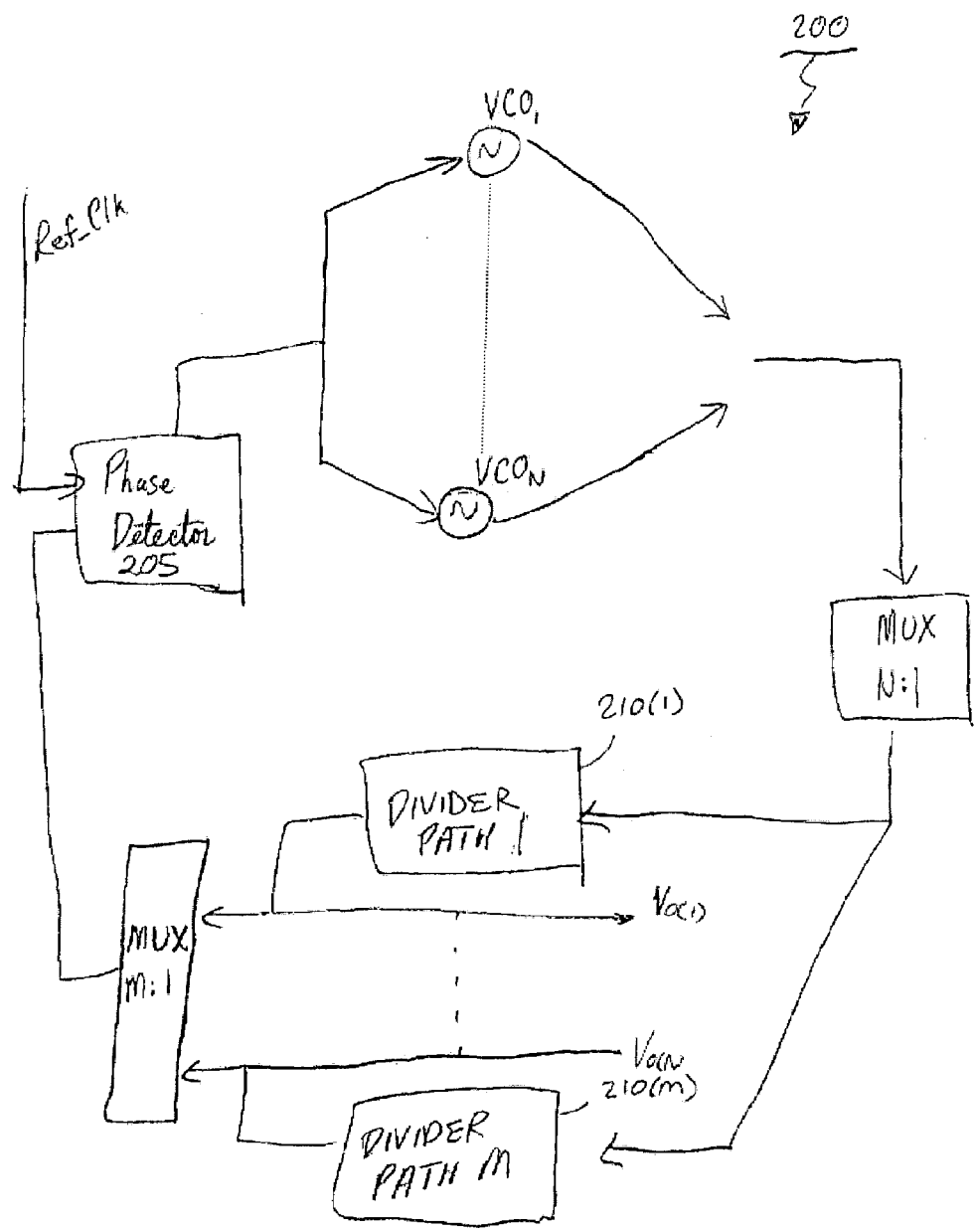
FIG. 2 is a block diagram of an exemplary voltage controlled oscillator with multiple voltage oscillators and multiple divider paths in accordance with an embodiment of the present invention.

Referring now to FIG. 2, there is illustrated a block diagram of an exemplary phase lock loop 200 with multiple divider paths and multiple selectable VCOs in accordance with an embodiment of the present invention. The phase lock loop 200 synchronizes reference clock signal, ref_clk, to a signal with any one of a plurality of different frequencies, thereby providing an output signal $V_{o(1)} \ldots V_{o(m)}$.

The reference clock signal, ref_clk, is received at a phase detector 205. The phase detector 205 provides an output signal that is a function of the phase difference between the reference clock signal, ref_clk, and a feedback signal.

The phase lock loop comprises a plurality of voltage controlled oscillators (VCOs), $VCO_1 \ldots VCO_n$. Each VCO, $VCO_1 \ldots VCO_n$, is centered at a particular frequency, $f_1 \ldots f_n$. The VCOs, $VCO_1 \ldots VCO_n$, provide a signal with a frequency that is offset from the center frequency. The offset is controllable by the voltage level applied to the VCO, $VCO_1 \ldots VCO_n$.

Each of the VCOs, $VCO_1 \ldots VCO_n$, are connected to an N:1 multiplexer, MUX, which selectively connects a particular one of the voltage controlled oscillators to a plurality of divider paths 210. The output of the VCO is provided to a plurality of divider paths 210(1) ... 210(m). Each divider path divides the signal from the selected VCO by a particular factor, thereby resulting in a plurality of signals $V_{o(1)} \ldots V_{o(m)}$ at different fractions of the VCO center frequency.

Each of the divider paths 210(0). 210(m) are connected to an m:1 multiplexer, MUX, which selectively feeds back a particular one of the divider paths 210(1). 210(m) to the phase detector 205.

Various embodiments of the present invention can be incorporated into a clock and data recovery (CDR) or clock multiplier unit (CMU) in a multi-rate transceiver, such as the multi-rate transceiver described in "Transceiver System and Method Supporting Variable Rates and Multiple Protocols", Provisional Application for Patent Ser. No. 60/423,070, by Caresosa, et. al., filed Nov. 1, 2002.

Figure 3:
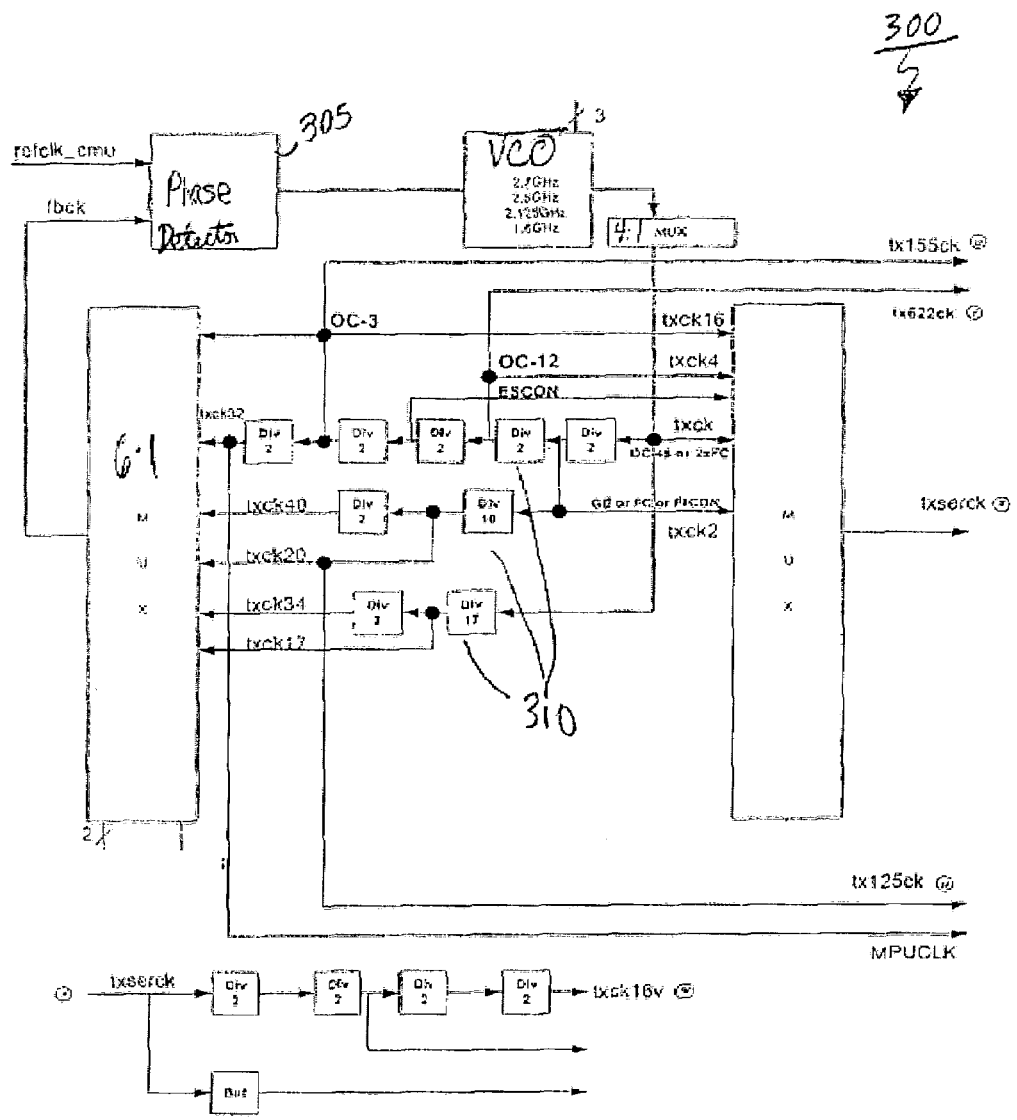
FIG. 3 is a block diagram of a clock multiplier unit in accordance with an embodiment of the present invention.

Referring now to FIG. 3, there is illustrated an exemplary CMU in accordance with an embodiment of the present invention. The CMU 300 synchronizes an reference clock signal, refclk_cmu, to a signal with any one of a plurality of frequencies.

The reference clock signal, refclk_cmu, is received at a phase detector 305. The phase detector 305 provides an output signal that is a function of the phase difference between the reference clock signal, refclk_cmu, and a feedback signal.

The phase lock loop comprises a plurality of VCOs. The VCOs are centered at 1.6 Ghz, 2.12 Ghz, 2.5 Ghz, and 2.7 Ghz. The VCOs provide a signal with a frequency that is offset from the center frequency. The offset is controllable by the voltage level applied to the VCO.

Each of the VCOs is connected to an 4:1 multiplexer, MUX, which selectively connects a particular one of the voltage controlled oscillators to a plurality of divider paths 310. The divider paths 310 are realized from DIV 2, DIV 10, and DIV 17 dividers. It is noted that the dividers, DIV, may form a portion of one or more divider paths. The divider paths 310 provide clock signals for OC-3, OC-12, OC-48, ESCON, Gigabit Ethernet, FICON.

The dividers, DIV, provide signals to a 6:1 multiplexer, MUX, which selectively feeds back a particular one of the signals to the phase detector 305.

Additionally, a plurality of signals from the dividers, DIV, are also received at another multiplexer, MUX. The MUX selects a particular one of the plurality of signals and outputs the selected signal, txserck. The output signal, txserck can also be received at additional dividers, DIV.

The CMU can be configured to output signals with a variety of frequency characteristics by appropriate selection of the reference clock frequency, VCO frequency, and the divider path. Various examples of frequencies that can be achieved, are listed below, along with the reference clock frequency, VCO frequency, and divider paths that can be used to achieve the frequency.

| Data Mode | Ref Clock frequency | VCO Out frequency | Divider Path/Value | txserck frequency |
|---|---|---|---|---|
| SONET Rates | | | | |
| FEC | 1.69E+08 | 2.70E+09 | 2×2×2×2 -> 16 | 2.70E+09 |
|  | 8.44E+07 | 2.70E+09 | 2×2×2×2×2 -> 32 | 2.70E+09 |
| OC48 | 1.56E+08 | 2.50E+09 | 2×2×2×2 -> 16 | 2.50E+09 |
|  | 7.81E+07 | 2.50E+09 | 2×2×2×2×2 -> 32 | 2.50E+09 |
| OC12 | 1.56E+08 | 2.50E+09 | 2×2×2×2 -> 16 | 2.50E+09 |
|  | 7.81E+07 | 2.50E+09 | 2×2×2×2×2 -> 32 | 2.50E+09 |
| OC3 | 1.56E+08 | 2.50E+09 | 2×2×2×2 -> 16 | 2.50E+09 |
|  | 7.81E+07 | 2.50E+09 | 2×2×2×2×2 -> 32 | 2.50E+09 |
| Gigabit Ethernet | 1.25E+08 | 2.50E+09 | 2×10 -> 20 | 1.25E+09 |
|  | 6.25E+07 | 2.50E+09 | 2×10×2 -> 40 | 1.25E+09 |
| Fibre-Channel | 1.06E+08 | 2.13E+09 | 2×10 -> 20 | 1.06E+09 |
|  | 5.31E+07 | 2.13E+09 | 2×10×2 -> 40 | 1.06E+09 |
|  | 1.25E+08 | 2.13E+09 | 17 | 1.06E+09 |
|  | 6.25E+07 | 2.13E+09 | 2×17 -> 34 | 1.06E+09 |
| 2× Fibre-Channel | 1.06E+08 | 2.13E+09 | 2×10 -> 20 | 2.13E+09 |
|  | 5.31E+07 | 2.13E+09 | 2×2×10 -> 40 | 2.13E+09 |
|  | 1.25E+08 | 2.13E+09 | 17 | 2.13E+09 |
|  | 6.25E+07 | 2.13E+09 | 2×17 -> 34 | 2.13E+09 |
| FICON | 8.00E+07 | 1.60E+09 | 2×10 -> 20 | 8.00E+08 |
|  | 4.00E+07 | 1.60E+09 | 2×2×10 -> 40 | 8.00E+08 |
| ESCON | 8.00E+07 | 1.60E+09 | 2×10 -> 20 | 2.00E+08 |
|  | 4.00E+07 | 1.60E+09 | 2×2×10 -> 40 | 2.00E+08 |

Figure 4:
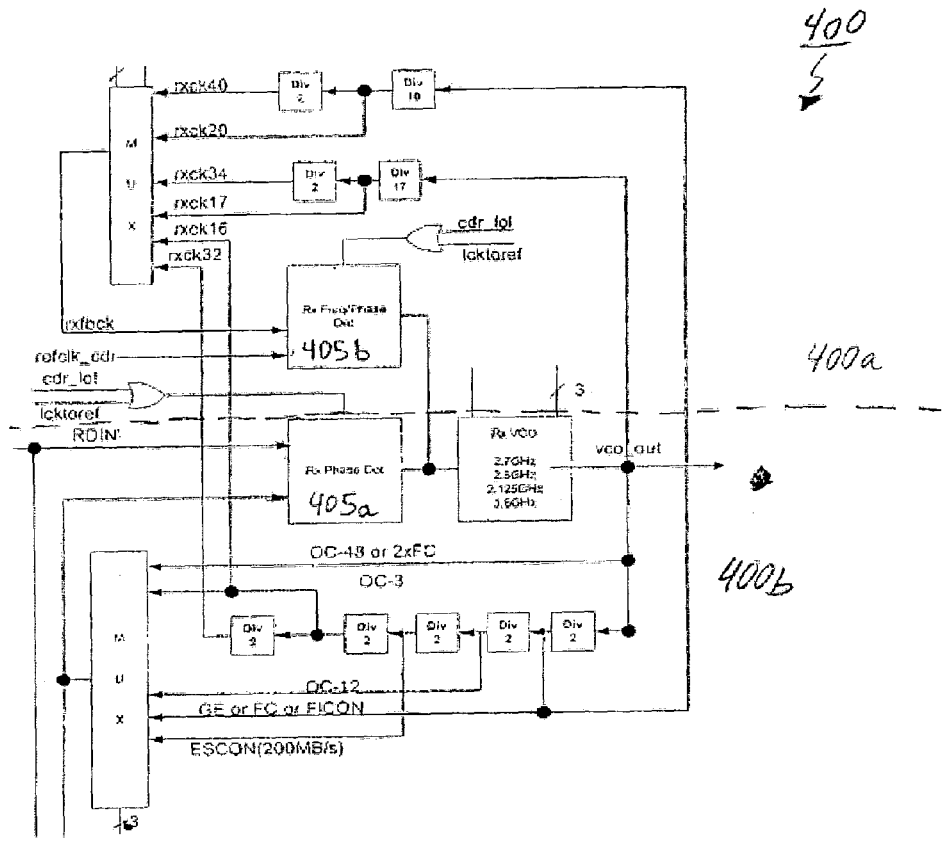
FIG. 4 is a block diagram of an exemplary CDR in accordance with an embodiment of the present invention.

Referring now to FIG. 4, there is illustrated a block diagram of an exemplary CDR 400 in accordance with an embodiment of the invention. The CDR 400 includes a frequency acquisition circuit loop 400a and a phase acquisition loop 400b.

The CDR 400 operates in one of two modes—a frequency acquisition mode, and a phase acquisition mode. At startup, the CDR 400 operates in the frequency acquisition mode wherein the frequency acquisition circuit loop 400a locks the frequency of a reference signal, efclk_cdr to a particular one of the frequencies. The particular frequency signal is generated by selection of a particular one of the VCOs in RxVCO and a particular one of the divider paths.

Upon frequency acquisition, the CDR 400 then enters the phase acquisition mode. During the phase acquisition mode, the phase acquisition circuit loop 400b synchronizes an incoming data signal with a particular one of the frequencies. The particular frequency signal is generated by selection of a particular one of the VCOs in RxVCO and particular one of the divider paths.

Figure 5:
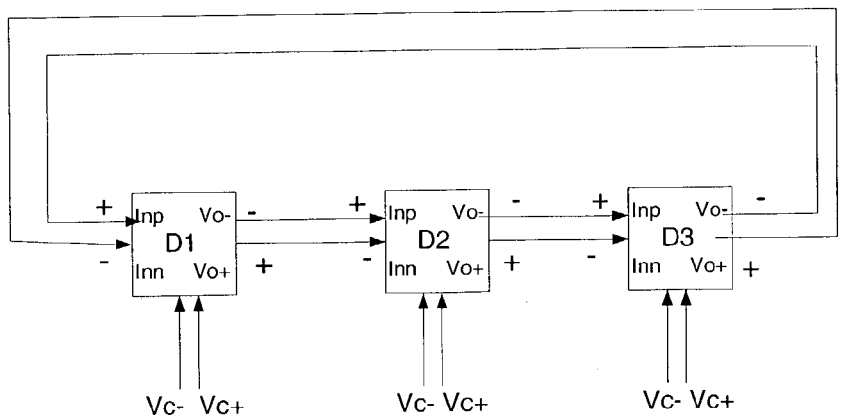
FIG. 5 is a block diagram of an exemplary oscillator.

Referring now to FIG. 5, there is illustrated a block diagram describing an exemplary VCO 500. The VCO 500 comprises delay units, D1, D2, and D3, connected in cascade. The delay units can comprise, for example, delay interpolators. The output of delay unit, D3, is provided as negative feedback to delay unit, D1. A feedback loop and an inverter, INV, provide the negative feedback.

The delay units, D1, D2, D3 delay an input signal for a certain period of time, T, before outputting the signal. Accordingly, an input pulse received at delay unit, D1, at 0 is received at the output at time 3T. Those skilled in the art will recognize that the output generates a signal with a frequency, ⅙T.

The period of time that the delay units, D1, D2, and D3, delay an input signal is controllable by a control voltage, Vc. A particular frequency, within a certain range, can be achieved by controlling the control voltage.

Figure 6:
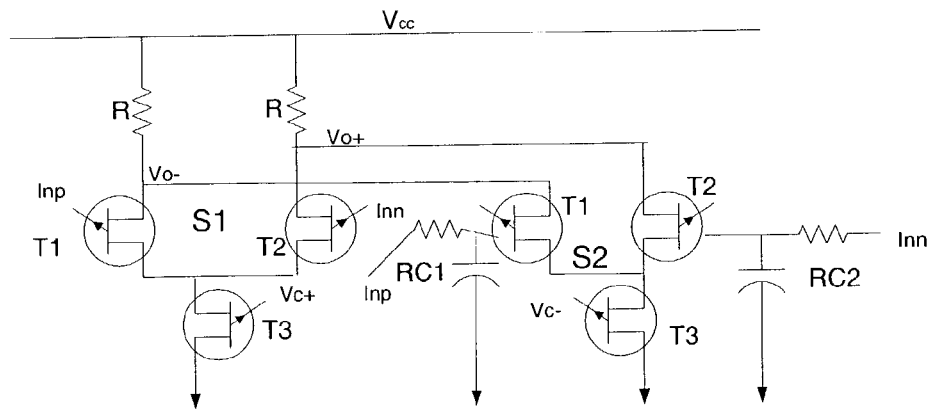
FIG. 6 is a block diagram of an exemplary delay unit.

Referring now to FIG. 6, there is illustrated a block diagram describing an exemplary delay interpolator. The delay interpolator comprises two stages, S0, S1. Each stage provides a different delay period. The sum of the delay periods for stages S0 and S1, is the delay period, T, for the delay interpolator.

Each stage S0, S1 comprises three transistors, T1, T2, and T3, wherein transistors T1 and T2 are connected in parallel with respect to each other, and in series with respect to transistor T3. The transistors, T1 and T2, are also connected to resistors R.

The delay interpolator includes input terminals for receiving a control voltage. In the stage, S1, the input terminal for receiving the positive control voltage, Vc+, is connected to the gate of transistor T3 of stage S1, while the terminal for receiving the negative control voltage, Vc−, is connected to the gate of transistor T3 of stage S2.

In the stage S2, resistor/capacitor (RC) circuits, RC1, RC2, are connected to the gates of the transistors T1, T2, respectively. The input terminal for receiving positive Inp is connected to the resistor portion of the RC circuit RC1. The input terminal for receiving Inn, is connected to the resistor portion of the RC circuit RC2. The output of the delay interpolator is the differential voltage between the drains of transistors T1 and T2 of the first stage S1 and the second stage S2. These outputs are subsequently connected to the inputs of the next delay cell. However, the positive output of the current delay cell is connected to the negative input of the next delay cell, while the negative output of the current delay cell is connected to the positive input of the next delay cell. The foregoing connection causes the phase shift resulting in the control of the Vco frequency.

The phase lock loop as described herein may be implemented as a board level product, as a single chip, application specific integrated circuit, or with varying levels of the phase lock loop integrated on a single chip with other portions of the system as separate components. The degree of integration of the monitoring system will primarily be determined by the data speeds, and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor can be implemented as part of an ASIC device.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. A phase lock loop, comprising:
   a phase detector;
   at least three voltage controlled oscillators connected to the phase detector;
   a first multiplexer connected to the plurality of voltage controlled oscillators; and
   a plurality of frequency divider paths connected to said plurality of voltage controlled oscillators, the frequency divider paths each being characterized by a different frequency divisor, the frequency divider paths being configured circuitally between an output of the first multiplexer and an input to a second multiplexer, the second multiplexer being configured circuitally between the frequency divider paths and the phase detector, the second multiplexer being connected to the phase detector; and at least one frequency divider path forming a portion of two or more of the plurality of frequency divider paths.

2. The phase lock loop of claim 1, wherein the voltage controlled oscillators comprise ring oscillators.

3. The phase lock loop of claim 1, wherein the second multiplexer comprises a plurality of inputs that provide a plurality of output signals of the phase lock loop.

4. The phase lock loop of claim 1, wherein at least some of the frequency divider paths are in parallel with each other.

5. The phase lock loop of claim 1,
wherein the first multiplexer selects a particular one of the voltage controlled oscillators, and
wherein at least some of the frequency divider paths comprise a plurality of dividers on a single frequency divider path, outputs of at least some of the plurality of dividers on the single frequency divider path providing output signals of the phase lock loop.

6. A phase lock loop, comprising:
a phase detector that compares phases between an input signal and a feedback signal;
at least three voltage controlled oscillators that generate a plurality of frequency signals with frequency offsets from a corresponding plurality of center frequencies, the frequency offsets being dependent on the comparison of the phases between the input signal and the feedback signal; and
a plurality of frequency divider paths that frequency divides at least one of the plurality of frequency signals, a plurality of frequency divider paths being connected to the at least three voltage controlled oscillators, the frequency divider paths each being characterized by a different frequency divisor, the frequency divider paths being configured circuitally between an output of a first multiplexer and an input to a second multiplexer, the second multiplexer being configured circuitally between the frequency divider paths and an input of the phase detector, the second multiplexer being connected to the input of the phase detector,
wherein at least one frequency divider path forms a portion of two or more of the plurality of frequency divider paths,
wherein a particular frequency divider path of the frequency divider paths comprises a plurality of frequency dividers, and
wherein at least some outputs of the plurality of frequency dividers of the particular frequency divider path provides at least some outputs of the phase lock loop.

7. The phase lock loop of claim 6, wherein the voltage controlled oscillators comprise ring oscillators.

8. The phase lock loop of claim 6, wherein the output of the first multiplexer is split between a first frequency divider path and a second frequency divider path which are part of the plurality of frequency divider paths.

9. The phase lock loop of claim 8, wherein the first frequency divider path comprises a first frequency divider and a second frequency divider, wherein an output of the first frequency divider provides an input to the second frequency divider, wherein the output of the first frequency divider provides an input to a portion of another frequency divider path.

10. The phase lock loop of claim 9, wherein at least some of the frequency divider paths are in parallel with each other.

11. The phase lock loop of claim 9, wherein the another frequency divider path comprises a third frequency divider that is not part of the first frequency divider path.

* * * * *